United States Patent
Iwata et al.

(10) Patent No.: US 8,638,188 B2
(45) Date of Patent: Jan. 28, 2014

(54) FUSIBLE LINK UNIT

(75) Inventors: Masashi Iwata, Makinohara (JP);
Shoichi Nomura, Makinohara (JP)

(73) Assignee: Yazaki Corporation, Tokyo (JP)

( * ) Notice: Subject to any disclaimer, the term of this patent is extended or adjusted under 35 U.S.C. 154(b) by 7 days.

(21) Appl. No.: 12/249,625

(22) Filed: Oct. 10, 2008

(65) Prior Publication Data
US 2009/0108981 A1    Apr. 30, 2009

(30) Foreign Application Priority Data

Oct. 31, 2007 (JP) ................................. 2007-283074

(51) Int. Cl.
*H01H 85/20* (2006.01)

(52) U.S. Cl.
USPC ............ 337/186; 337/207; 337/208; 337/209

(58) Field of Classification Search
USPC .......................................... 337/186, 207–209
See application file for complete search history.

(56) References Cited

U.S. PATENT DOCUMENTS

| | | | |
|---|---|---|---|
| 5,034,620 A * | 7/1991 | Cameron | 307/10.7 |
| 5,645,448 A * | 7/1997 | Hill | 439/522 |
| 6,294,978 B1 * | 9/2001 | Endo et al. | 337/166 |
| 6,509,824 B2 * | 1/2003 | Inaba et al. | 337/295 |
| 6,576,838 B2 * | 6/2003 | Matsumura | 174/66 |
| 6,796,802 B2 * | 9/2004 | Iwata | 439/34 |
| 7,176,780 B2 * | 2/2007 | Iwata | 337/188 |
| 7,192,319 B1 * | 3/2007 | Rahman et al. | 439/766 |
| 7,663,466 B1 * | 2/2010 | Jetton | 337/191 |
| 2002/0163416 A1 * | 11/2002 | Matsumura | 337/112 |
| 2004/0008503 A1 * | 1/2004 | Higuchi et al. | 361/833 |
| 2005/0116806 A1 * | 6/2005 | Iwata | 337/188 |
| 2005/0285709 A1 * | 12/2005 | Matsumura et al. | 337/227 |
| 2009/0061291 A1 * | 3/2009 | Ohashi et al. | 429/65 |
| 2010/0019572 A1 * | 1/2010 | Kudo et al. | 307/10.7 |

FOREIGN PATENT DOCUMENTS

| | | |
|---|---|---|
| JP | 63-182048 U | 11/1988 |
| JP | 64-19261 U | 1/1989 |
| JP | 5-15297 U | 2/1993 |

* cited by examiner

*Primary Examiner* — Anatoly Vortman
(74) *Attorney, Agent, or Firm* — Sughrue Mion, PLLC

(57) ABSTRACT

A fusible link unit includes a retaining portion that retains a frame portion of a battery. The frame portion is located at a corner portion of the battery. The retaining portion has a pair of leg portions which abut against two side surfaces forming the corner portion of the battery.

1 Claim, 13 Drawing Sheets

FUSIBLE LINK UNIT

BACKGROUND

The present invention relates to a structure for assembling a fusible link unit which is fixed to a post of a battery for a motor vehicle.

As a conventional structure for assembling a fuse box, a technique shown in FIG. 11 is known (patent document 1). As shown in FIG. 11, a fuse box 100 is mounted to a pole terminal 112 of a battery 110 by means of a connection bar 114 and is also mounted to a liquid opening portion by means of a mounting arm 116 and an inspection liquid cap 118.

In addition, as another technique, as shown in FIG. 12, a technique is known in which retaining members 124 and 126 are respectively provided on a battery 120 and a fuse box 122, and the fuse box 122 is mounted to the battery by engaging the both retaining members 124 and 126 (refer to patent document 2).

Furthermore, as still another technique, as shown in FIG. 13, a technique is known in which a battery terminal 134, to which a terminal 132 extended from a fuse box 130, is obliquely held by battery 136, and the position of the fuse box 130 is thereby offset (refer to patent document 3).

Each of the above-described fuse boxes is for interrupting the electric current when an overcurrent has occurred by means of a fuse accommodated inside. However, instead of the fuse, a fusible link unit is also used which is provided with a similar function by forming a fusible portion integrally with a bus bar.

[Patent Document 1] JP-UM-A-63-182048
[Patent Document 2] JP-UM-A-64-19261
[Patent Document 3] JP-UM-A-5-15297

However, with the above-described conventional configurations, it is necessary to provide retaining portions of special structures on both the fuse box and the battery, and batteries and fuse boxes, for which positions of retaining portions differ for type of vehicle, are required, so that the structure of assembling the fuse box lacks versatility. In addition, in the case where a multipolarized fuse box or fusible link unit is disposed on a side surface of the battery, a configuration is desired which is outstanding in the tightening operability of the nut of a battery terminal and the routability of the wire harness are excellent.

SUMMARY

Accordingly, an object of the invention is to provide a a fusible link unit which can be used irrespective of a vehicle type and hence excels in the versatility, and which is outstanding in the tightening operability of the nut of the battery terminal and in the routability of the wire harness, thereby overcoming the above-described problems.

The above-described object of the invention can be attained by the following configurations.

(1) There is provided a fusible link unit, comprising:
a retaining portion that retains a frame portion of a battery, the frame portion being located at a corner portion of the battery,
wherein the retaining portion has a pair of leg portions which abut against two side surfaces forming the corner portion of the battery.

(2) Preferably, at least one of the leg portions has a hook portion which retains the frame portion of the battery.

(3) Preferably, at least one of the leg portions is a flexible portion which is resiliently brought into contact with one of the side surfaces of the battery.

According to the configuration of item (1) above, since the retaining portion of the fusible link unit is constituted by a pair of leg portions which abut against the two side surfaces forming the corner portion of the battery, a battery terminal can be disposed and fixed so as to be oriented toward the corner portion, so that a bolt for fixing the battery terminal to a battery post can be positioned so as to be oriented toward the operator side.

In addition, since the battery terminal can be disposed so as to be oriented from the battery post toward the corner portion, the fusible link unit can be assembled so as to be offset from the battery, or can be assembled obliquely with respect to the side surface of the battery.

According to the configuration of item (2) above, since the hook portion of at least one leg portion retains the frame portion of the battery, when a connecting portion of a fusible link unit main body is tightened to or loosened from a stud bolt of the battery terminal by a nut, part of the stress of the rotational torque applied to the connecting portions of the fusible link unit main body and the battery terminal is received by the battery corner portion. Accordingly, it is possible to alleviate the burden of the stress applied to these parts during assembly or maintenance.

According to the configuration of item (3) above, since at least one leg portion is resiliently brought into contact with one of the battery side surfaces, the battery terminal is fixed in a state in which it is pulled by the fusible link unit and the battery post. Accordingly, even if the model of the vehicle-mounted battery is changed, and the position of the battery post is changed, the dimensional difference can be absorbed by the amount of deflection of the resiliently contacting other leg portion. As a result, even in cases where the battery size is different as in a motor vehicle for a cold district, the identical fusible link unit can be commonly used.

In addition, in the configuration in which one of the pair of leg portions of the retaining portion has a hook portion, by effecting assembly by deflecting the other flexible leg portion, the hook portion can be easily retained at the frame portion of the battery, so that assembly can be facilitated.

According to the invention, since the retaining portion of the fusible link unit has the pair of leg portions which abut against the two side surfaces forming the corner portion of the battery, the battery terminal can be disposed and fixed in such a manner as to be oriented toward the corner portion, so that the bolt for fixing the battery terminal to the battery post can be positioned in such a manner as to be oriented toward the operator side. Accordingly, the tightening operation with an impact wrench or the like can be performed without interfering with other parts, so that the tightening operation is facilitated.

In addition, since the battery terminal can be disposed in such a manner as to be oriented from the battery post toward the corner portion, the fusible link unit can be assembled so as to be offset from the battery, or can be assembled obliquely with respect to the side surface of the battery. Hence, the routing of the wire harness is facilitated, and routability improves.

BRIEF DESCRIPTION OF THE DRAWINGS

The above objects and advantages of the present invention will become more apparent by describing in detail preferred exemplary embodiments thereof with reference to the accompanying drawings, wherein.

DETAILED DESCRIPTION OF EXEMPLARY EMBODIMENTS

Figure 1:
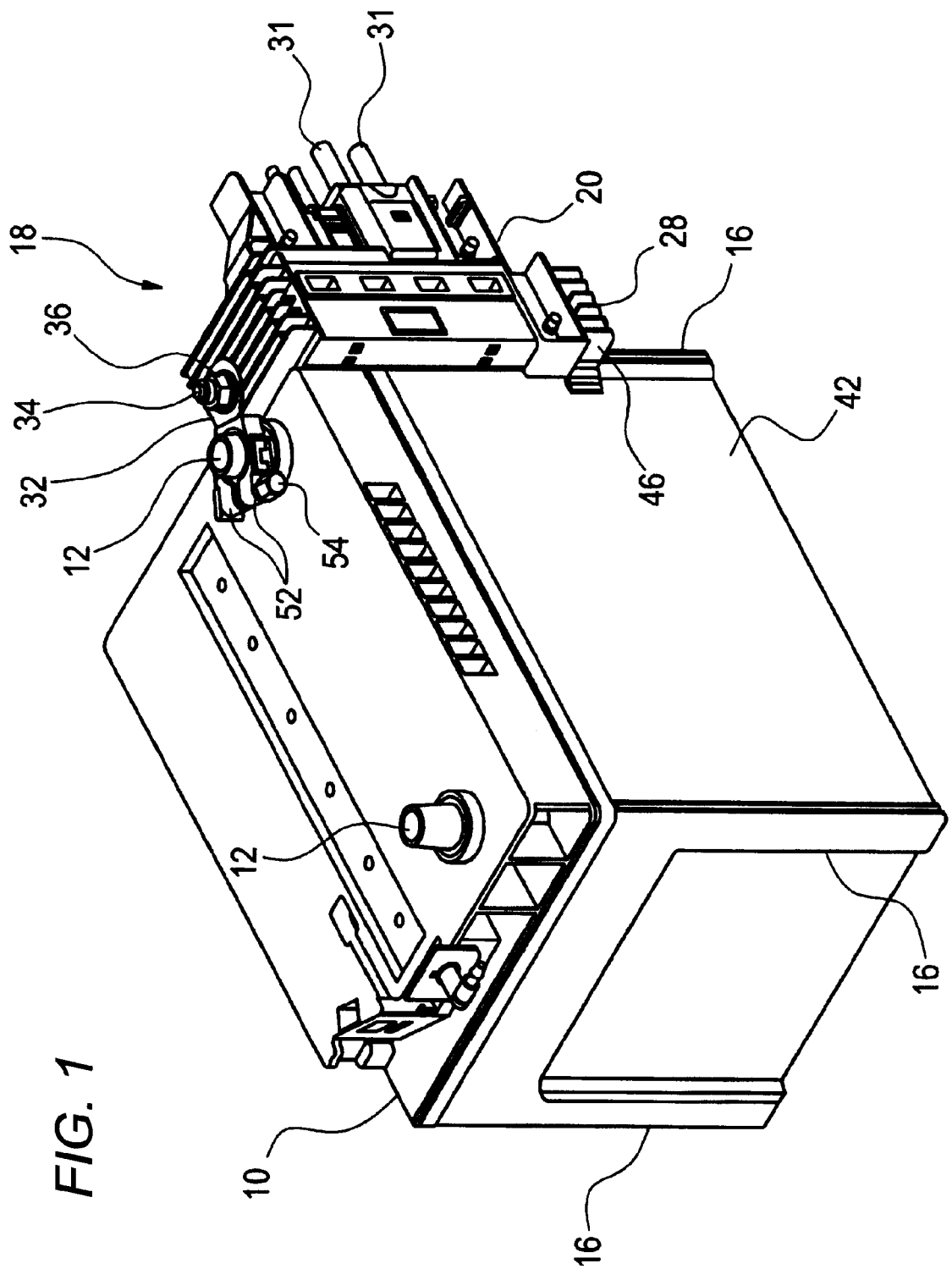
FIG. 1 is a schematic diagram of the assembling of a fusible link unit in accordance with a first embodiment of the invention.
Figure 2:
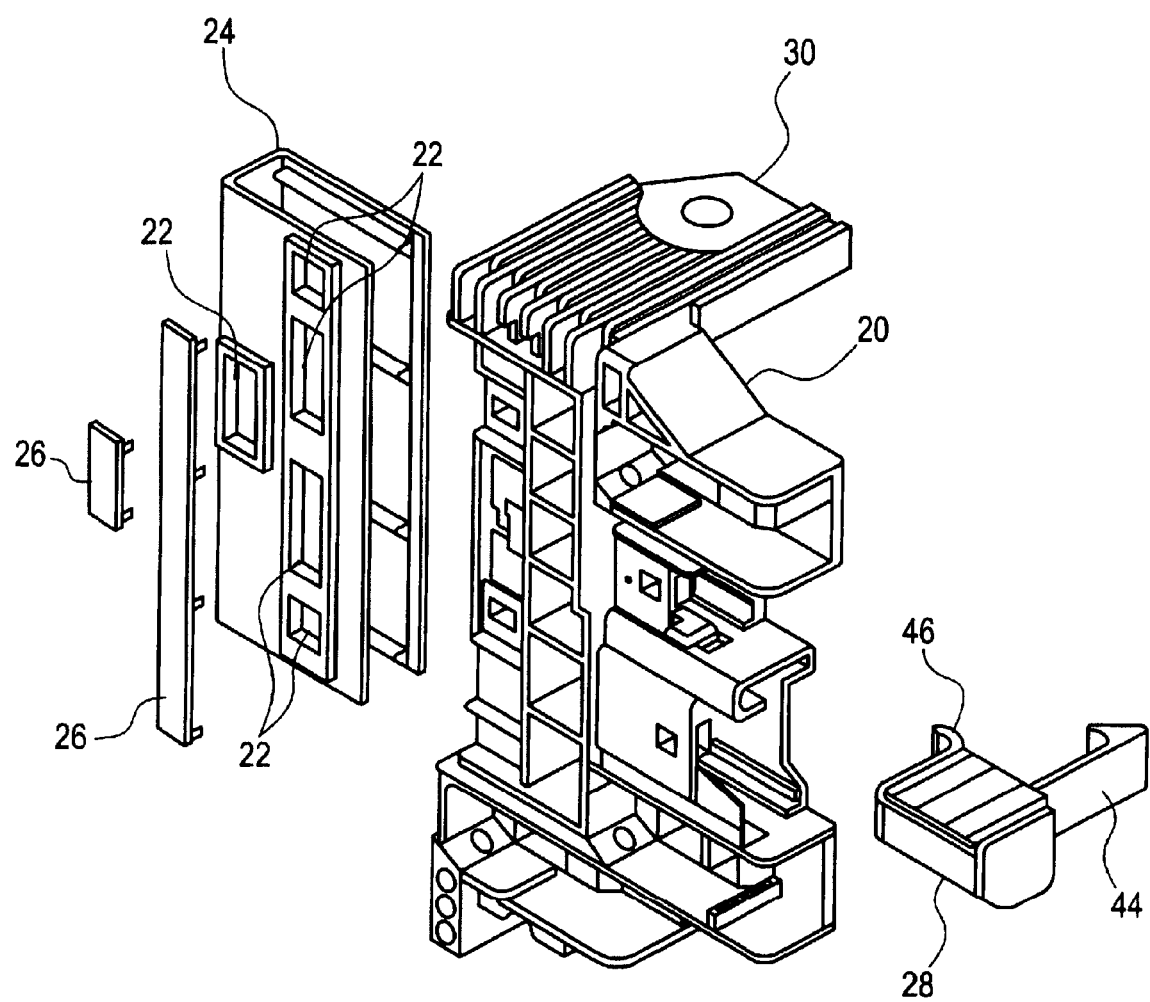
FIG. 2 is an exploded perspective view of the fusible link unit.
Figure 3:
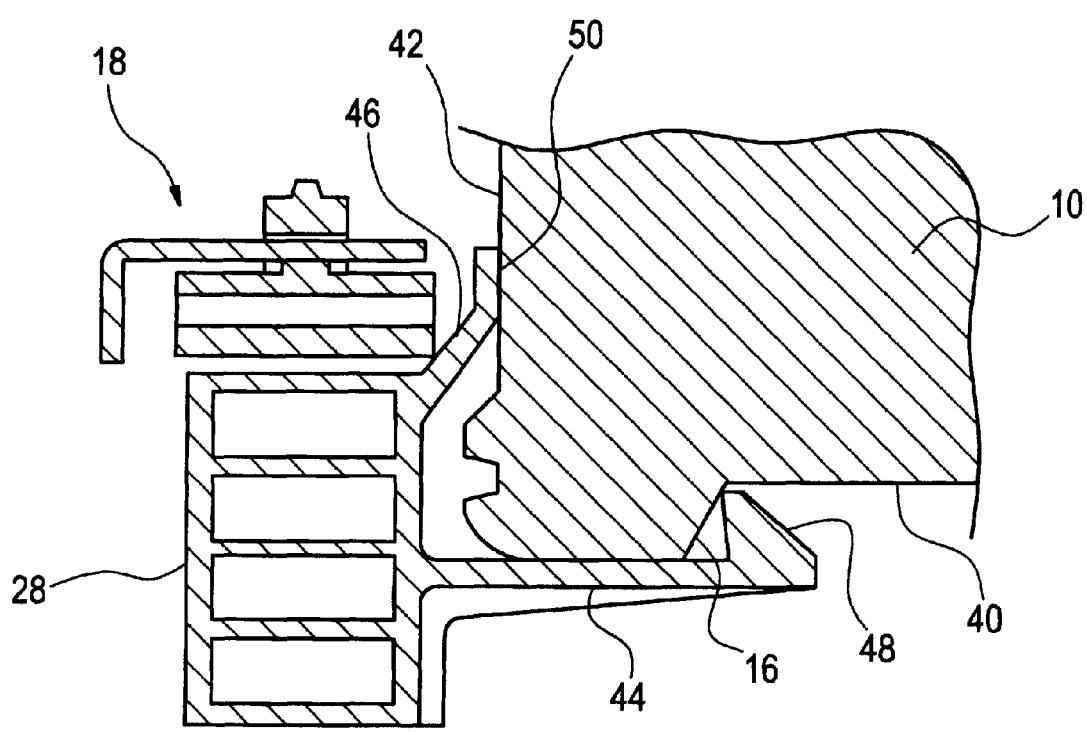
FIG. 3 is a cross-sectional view of a fixing portion of the fusible link unit shown in FIG. 1.

Referring now to the accompanying drawings, a description will be given of an embodiment of the invention. FIG. 1 is a perspective view of a fusible link unit in accordance with a first embodiment of the invention. FIG. 2 is an exploded perspective view of the fusible link unit. FIG. 3 is a cross-sectional view of a fixing portion of the fusible link unit.

A battery 10 has battery posts 12 of a positive and a negative polarity respectively provided on its upper surface, and frame portions 16 protruding in column form are provided at its respective corner portions in a plan view.

A fusible link unit 18 consists of a fusible link unit main body 20 (hereafter referred to as the main body), a cover 24 having windows 22 for visually confirming a fusible link (not shown), caps 26 for covering the windows 22, and a bracket 28 for assembling the battery. The main body 20 is made of a resin, and a bus bar 30 having integrally molded fusible portions is insert-molded therein. A wire harness 31, which is connected to various electrical parts, is connected to the bus bar 30 by means of connectors. The bus bar 30 of the main body 20 is tightened and fixed to a stud bolt 34 of a battery terminal 32 by a nut 36, and the battery terminal 32 is assembled to the battery post 12.

The electric current flowing from the battery 10 passes through the bus bar 30 and the fusible link and is supplied to downstream circuits. In the event that an abnormal current has been generated, the fusible link melts down to interrupt the flow of the electric current, thereby preventing damage, such as smoke generation from the wire harness 31.

A pair of L-shaped leg portions 44 and 46 are provided in the bracket 28. The leg portions 44 and 46 serve as retaining portions for abutment against two side surfaces 40 and 42 forming a corner portion of the battery 10. One leg portion 44 has flexibility and has a hook portion 48 provided at its distal end, while the other leg portion 46 similarly has flexibility and has an abutment surface 50 provided at its distal end. One leg portion 44 extends toward the one side surface 40 for forming the corner portion of the battery 10, and its hook portion 48 is adapted to retain the frame portion 16 of the battery, while the other leg portion 46 extends toward the other side surface 42, and its abutment surface 50 is adapted to be resiliently brought into contact with the other side surface 42.

Figure 4:
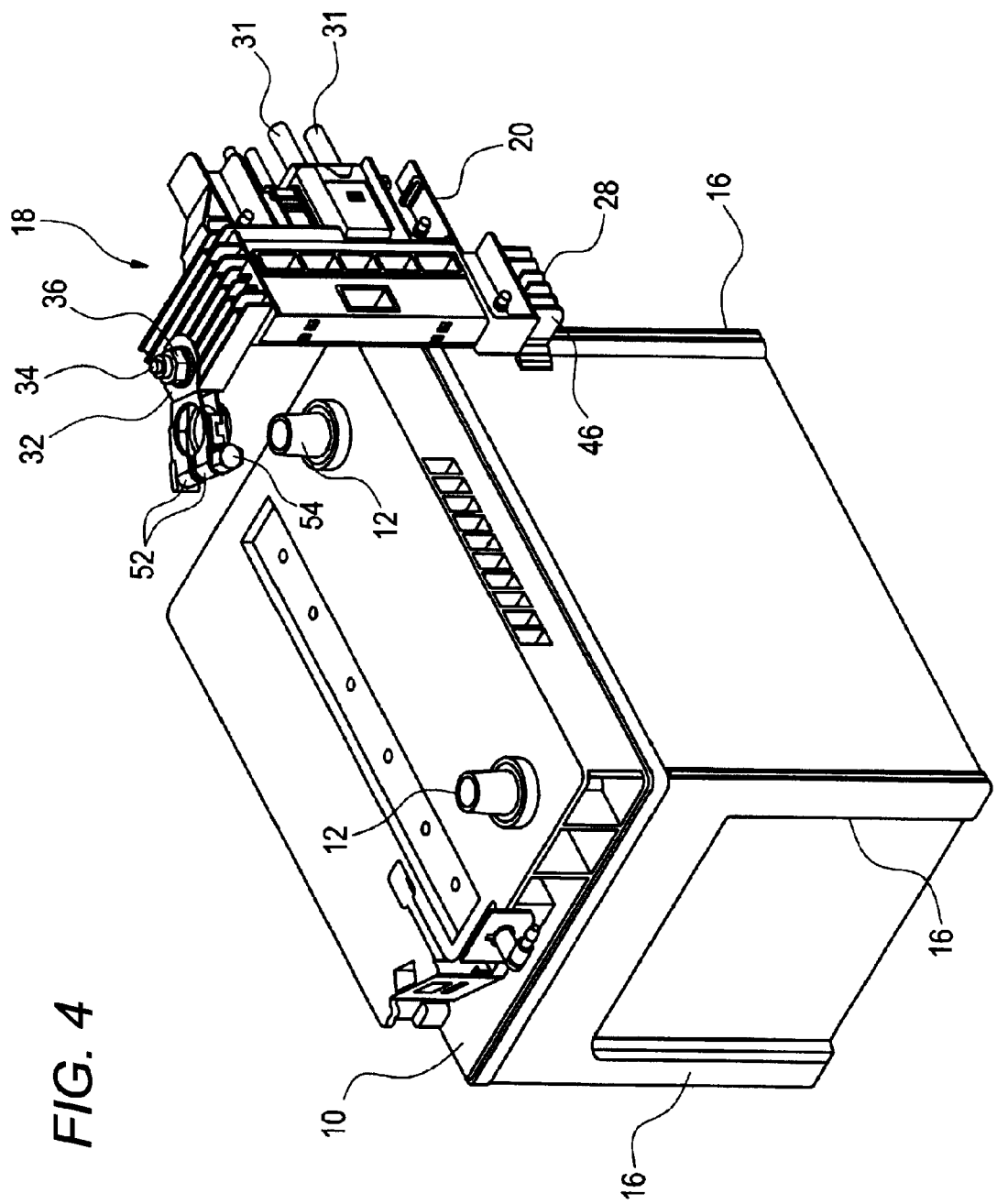
FIG. 4 is a process diagram of the assembling of the fusible link unit.
Figure 5:
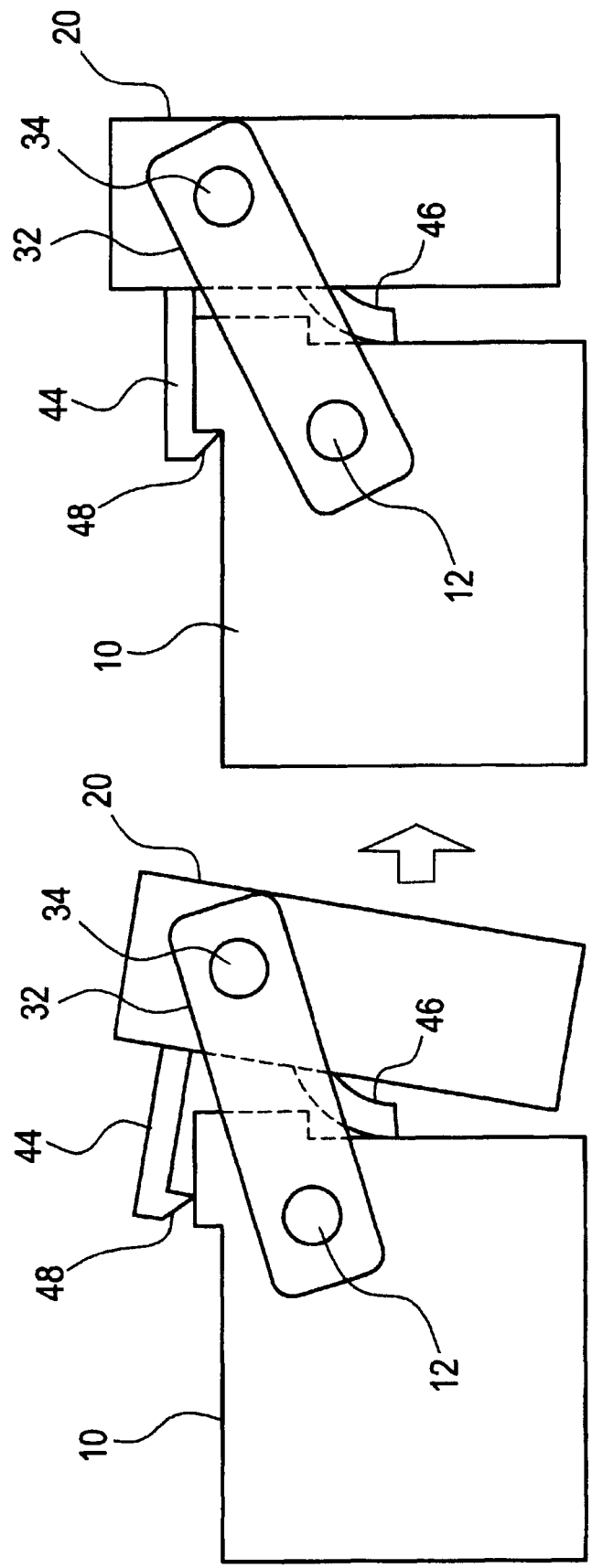
FIG. 5 is a process diagram of the assembling of the fusible link unit.

To fix the main body 20 to the battery 10, as shown in FIG. 4, the leg portions 44 and 46 of the bracket 28 provided on the main body 20 are first abutted against the respective side surfaces 40 and 42 to retain the frame portions 16 of the battery 10, and the bus bar 30 is subsequently fixed by the nut 36 to the stud bolt 34 provided at one end of the battery terminal 32. Here, to retain the frame portions 16 by the leg portions 44 and 46, as shown in FIG. 5, with the hook portion 48 of the one leg portion 44 abutting against the surface of the frame portion 16, the abutment surface 50 of the other leg portion 46 is pressed against the side surface 42 of the battery 10 so as to be resiliently brought into contact therewith. The hook portion 48 is pressed and moved along the surface of the frame portion 16, and the end portion of the frame portion 16 is retained by the hook portion 48. This allows the hook portion 48 of the leg portion 44 to smoothly retain the frame portion 16.

Figure 6:
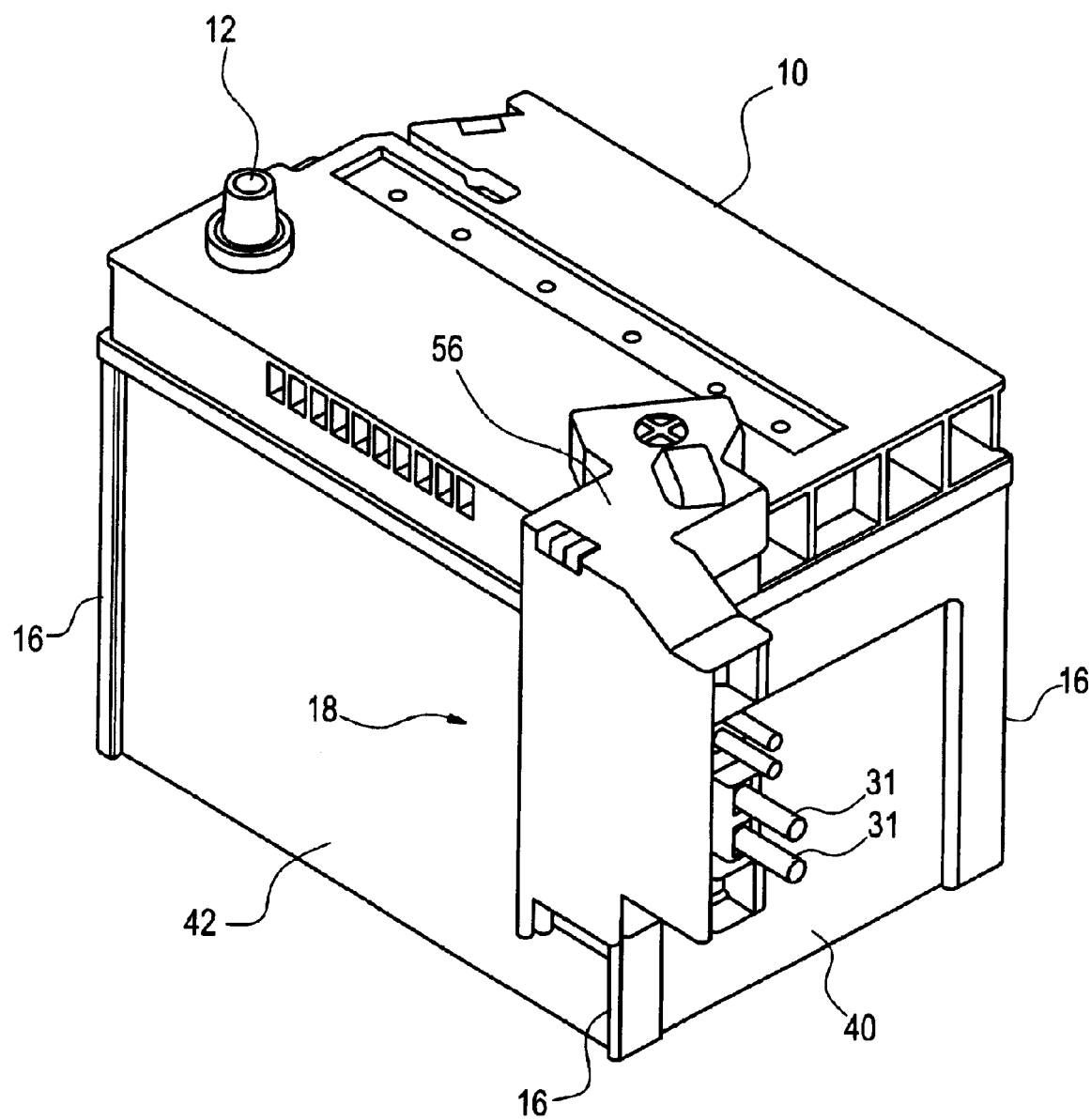
FIG. 6 is a perspective view after the assembling of the fusible link unit.

Next, the other end of the battery terminal 32 is fixed to the battery post 12. The other end of the battery terminal 32 is so arranged that a pair of clamping pieces 52 are placed on the battery post 12 from above to clamp the battery post 12. As the clamping pieces 52 are tightened by a bolt 54, the battery terminal 32 is fixed to the battery post 12. After the battery terminal 32 is fixed to the battery post 12, the battery terminal 32 is covered by a cover 56 which is placed on top of the main body 20, as shown in FIG. 6.

Figure 7:
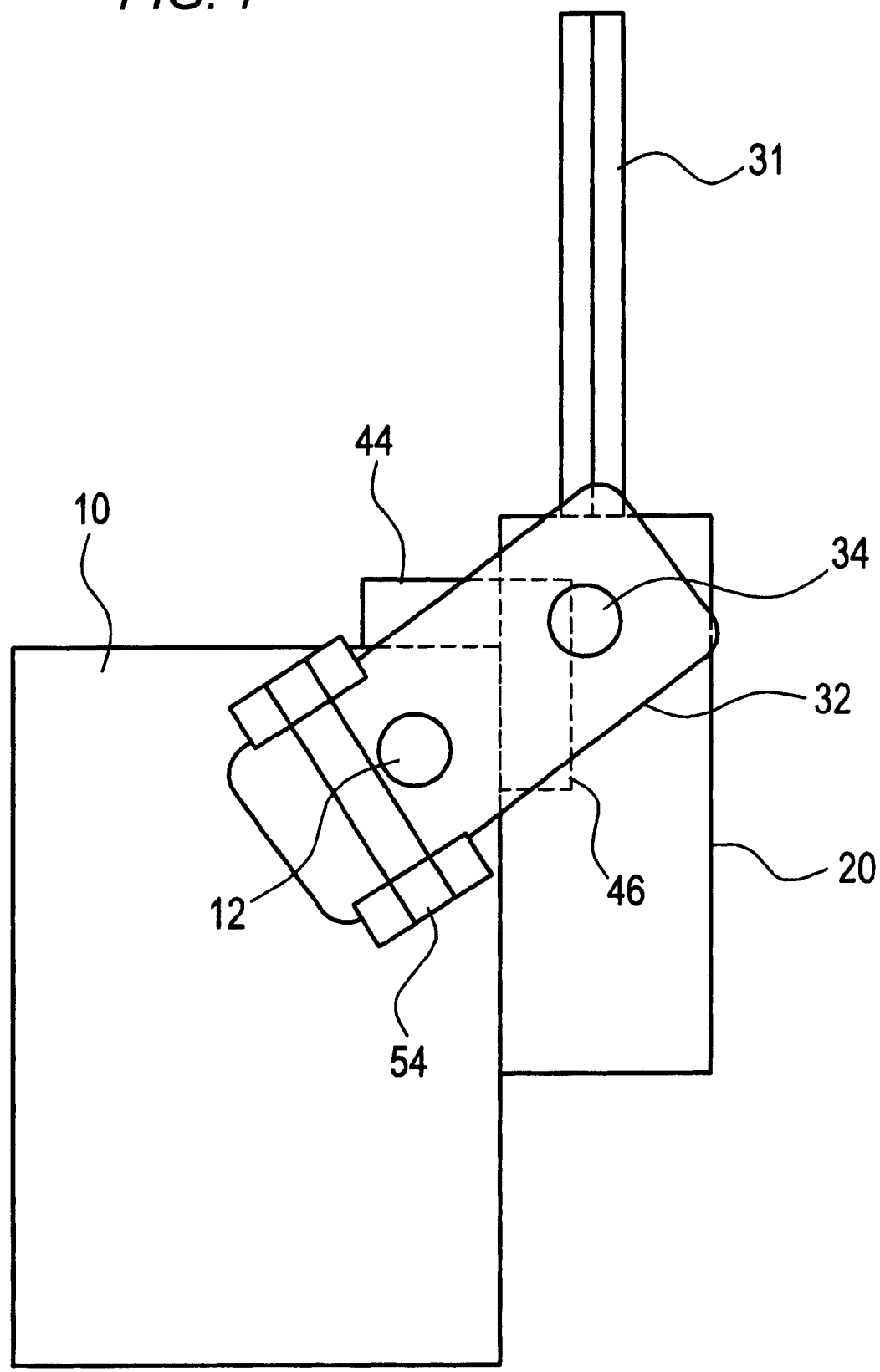
FIG. 7 is a schematic diagram of the assembled state of the fusible link unit.
Figure 8:
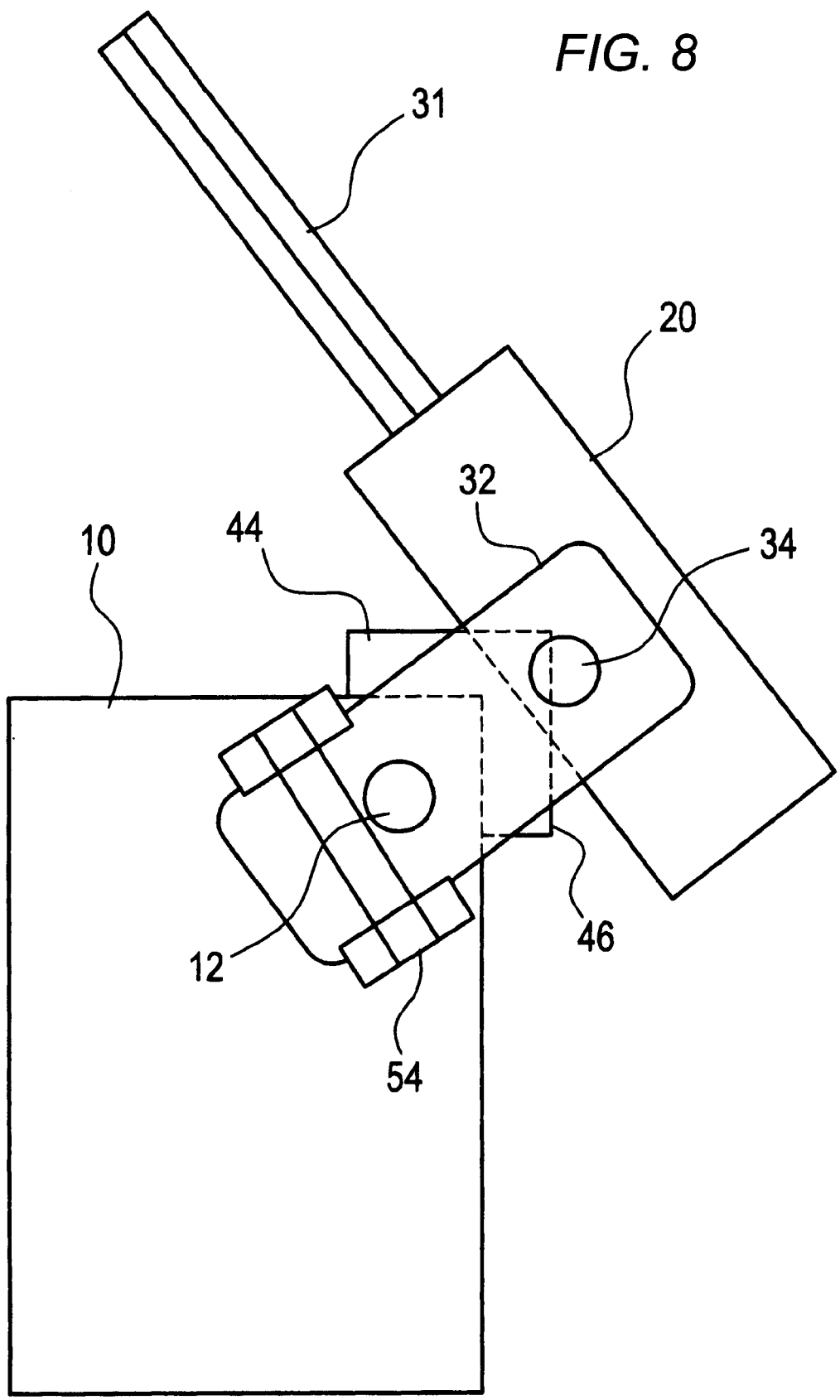
FIG. 8 is a schematic diagram of another assembled state of the fusible link unit.

As the main body 20 is mounted such that the orientation of the battery terminal 32 with respect to the battery 10 is directed from the battery post 12 toward the corner portion of the battery, the main body 20 is mounted at a desired position. For example, as shown in FIG. 7, the main body 20 is mounted in such a manner as to be offset with respect to the battery 10, or as shown in FIG. 8, the main body 20 is mounted obliquely at an angle with respect to the side surfaces 40 and 42 of the battery 10. Thus, since the orientation of the main body 20 can be set in conformity to the layout environment of the surroundings of the battery 10, the main body 20 can be mounted in a direction in which the wire harness 31 can be easily routed, so that the routability of the wire harness 31 improves.

Figure 9:
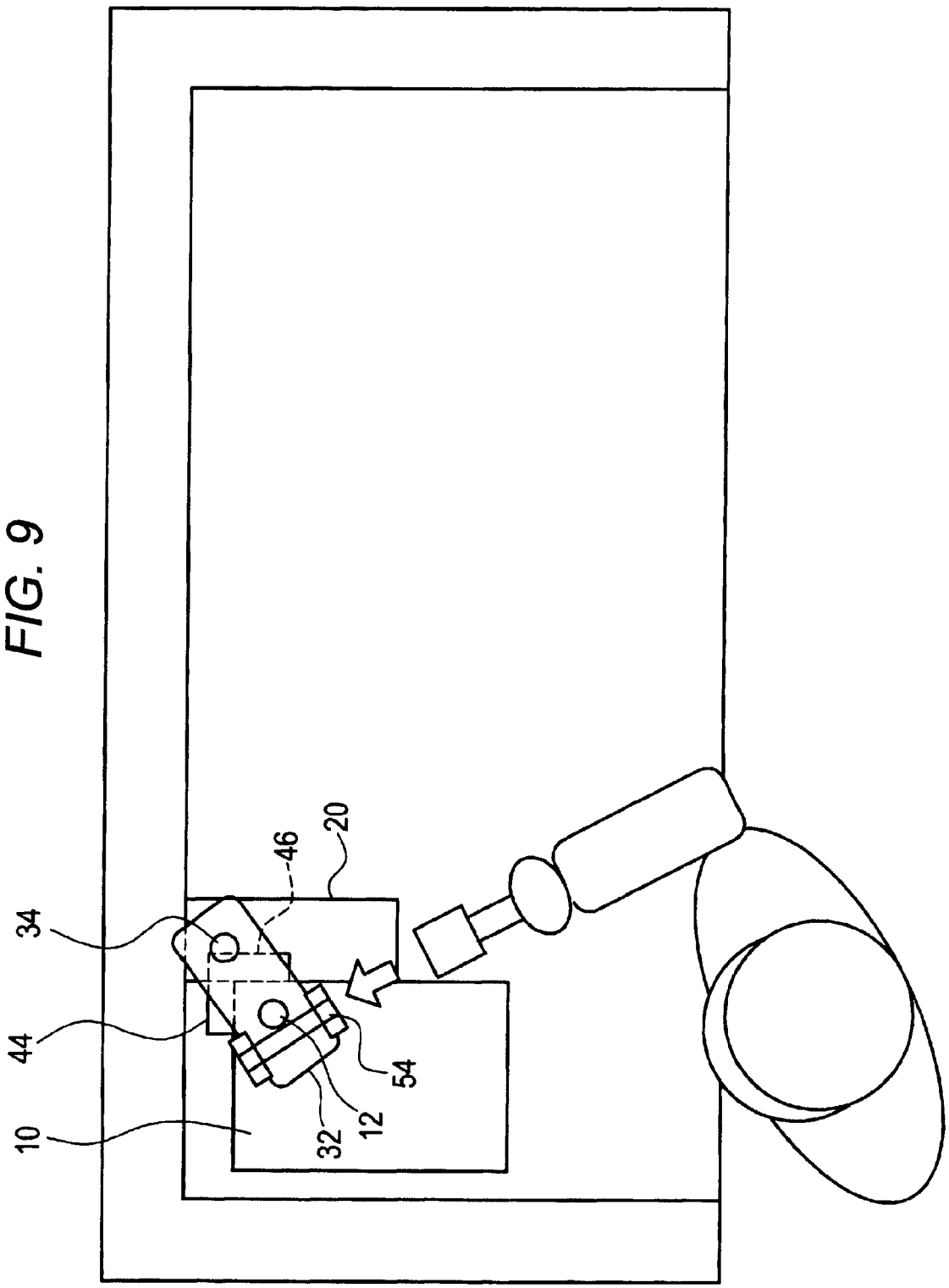
FIG. 9 is a process diagram illustrating the assembling of the fusible link unit by an operator.

In addition, if the battery terminal 32 is disposed and fixed in such a manner as to be oriented from the battery post 12 toward the corner portion of the battery, the fixing bolt 54 for the battery terminal 32 can be directed toward the operator, as shown in FIG. 9. Accordingly, the operation of tightening the bolt 54 with an impact wrench or the like is extremely facilitated for the operator.

In addition, since the hook portion 48 of the one leg portion 44 retains the frame portion 16, when the operator tightens the battery terminal 32 to the stud bolt 34 by the nut 36, part of the stress of the rotational torque applied to the main body 20 and the battery terminal 32 is received by the battery corner portion. Accordingly, the burden of the stress applied to the main body 20 and the battery terminal 32 can be alleviated during assembly or maintenance. Namely, as shown in FIG. 10, of a stress F1 which is applied to the battery terminal 32 in a rotational torque F0 for tightening the stud bolt 34, it is possible to alleviate the portion of F2.

Figure 10:
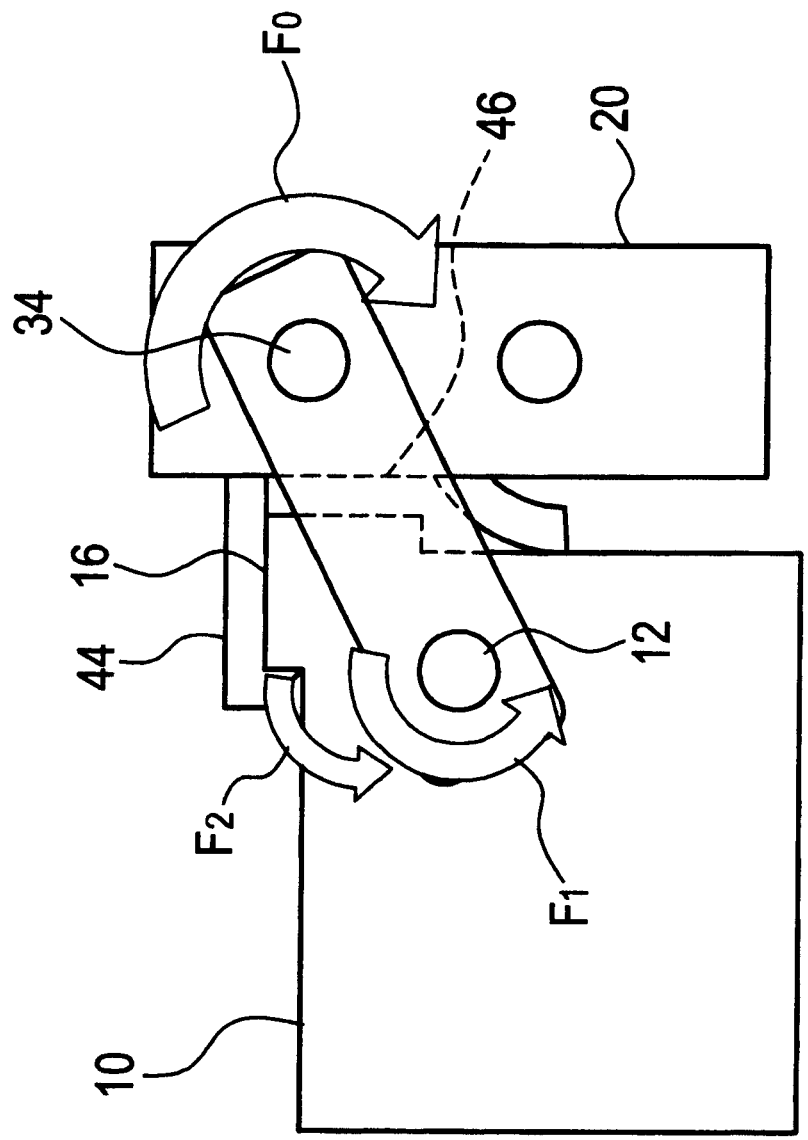
FIG. 10 is a schematic diagram of the torque during bolt tightening.
Figure 11:
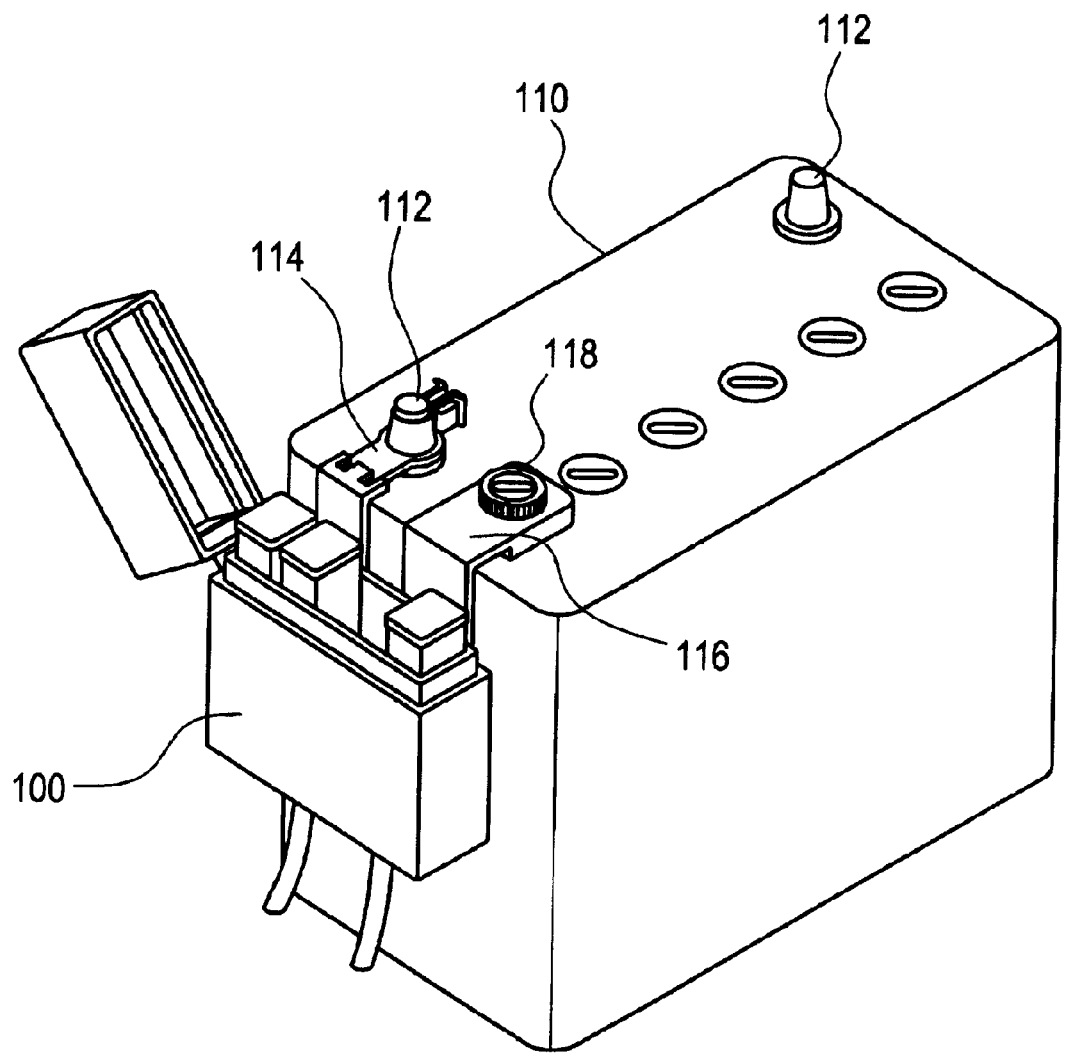
FIG. 11 is a schematic diagram of the assembling of a fusible link unit in accordance with a conventional technique.
Figure 12:
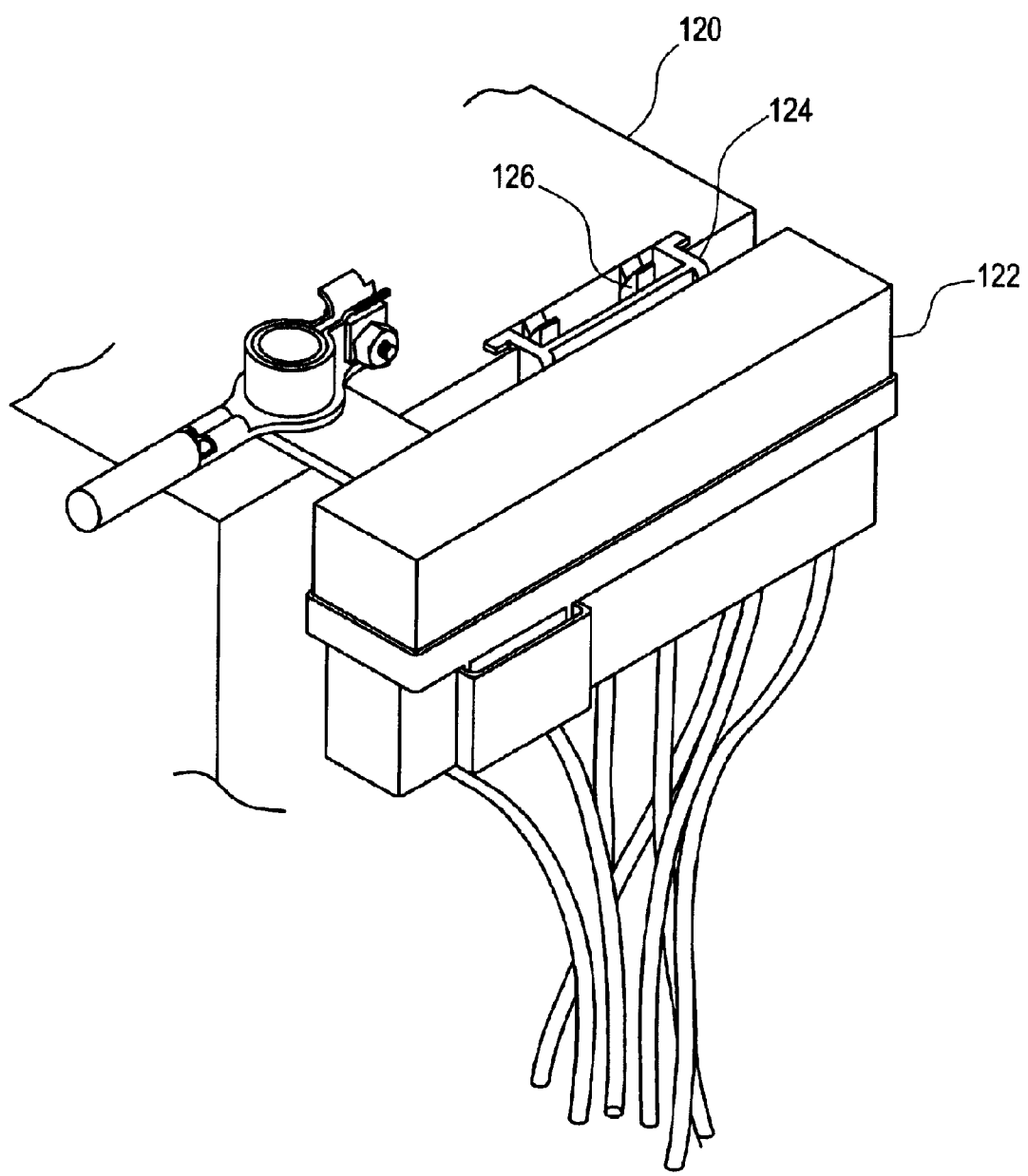
FIG. 12 is a schematic diagram of the assembling of a fusible link unit in accordance with another conventional technique.
Figure 13:
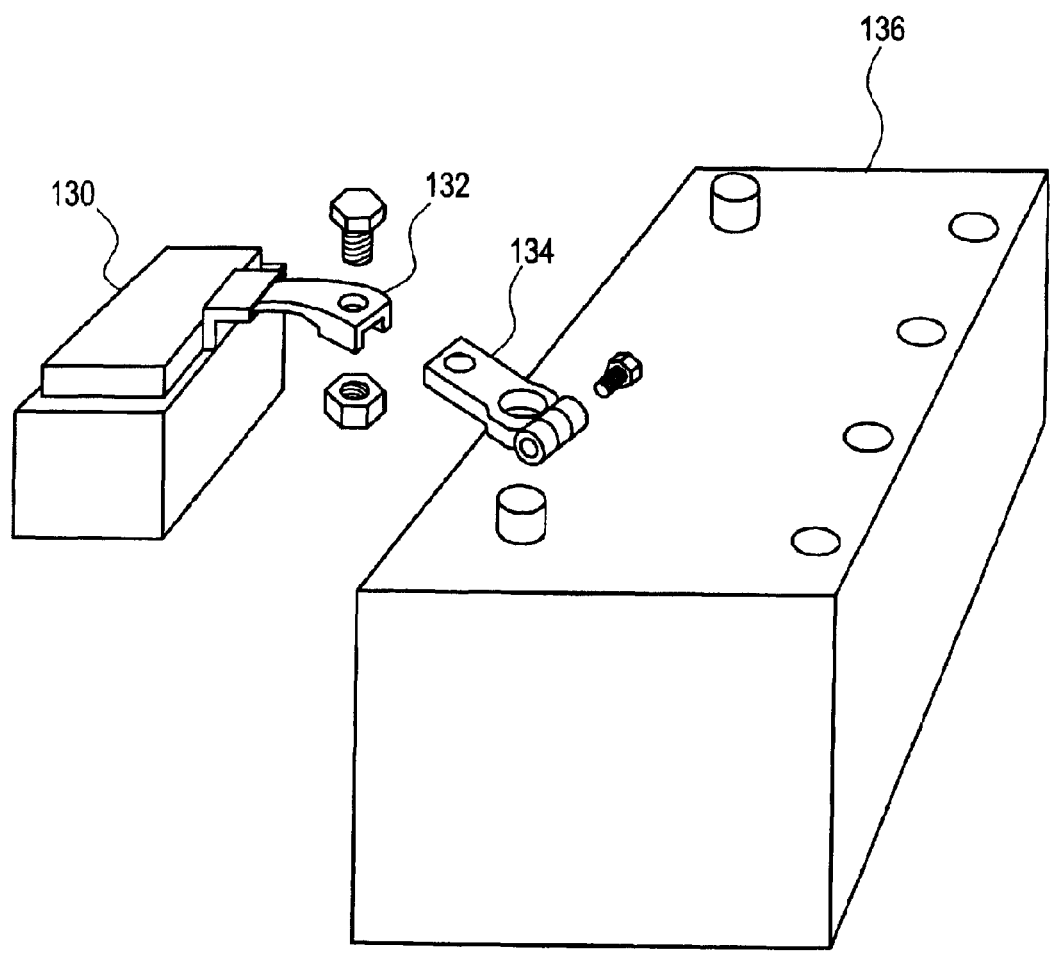
FIG. 13 is a schematic diagram of the assembling of a fusible link unit in accordance with still another conventional technique.

In addition, since the hook portion 48 of the one leg portion 44 retains the frame portion 16, in the example of FIG. 10 it is possible to prevent the main body 20 from rotating in a clockwise rotating direction.

In addition, since the other leg portion 46 is in a cantilevered state and is resiliently brought into contact with the side surface 42 of the battery 10, by virtue of its counteraction the fusible link unit 18 can be supported and fixed in such a manner as to thrust against the battery post 12. Accordingly, it is possible to prevent the vibration of the fusible link unit 18, and the fusible link unit 18 is able to withstand shocks from the outside.

In addition, even if the model of the vehicle-mounted battery is changed, and the position of the battery post 12 is changed, the amount of displacement of the battery post 12 can be absorbed by the amount of deflection of the other leg portion 46. As a result, even in cases where the battery size is different from a normal one as in a motor vehicle for a cold district, the identical fusible link unit 18 can be commonly used.

It should be noted that the invention is not limited to the above-described embodiment, and various modifications are possible based on the technological concept of the invention. For example, an arrangement may be provided such that the hook portion 48 is provided on each of the pair of leg portions 44 and 46, and each hook portion 48 retains the frame portion 16. In this case, since the hook portions 48 of the both leg portions 44 and 46 retain the frame portions 16, when the operator loosens the nut 36 which tightened the battery terminal 32, part of the stress of the rotational torque applied to the main body 20 and the battery terminal 32 can be received by the battery corner portion. Accordingly, it is possible to alleviate the burden of the stress applied to the main body 20 and the battery terminal 32 during maintenance. Namely, of the stress which is applied to the battery terminal 32 in the rotational torque opposite to the rotational torque F0 shown in FIG. 10, it is possible to alleviate the portion of the rotational torque opposite to F2.

Although the invention has been illustrated and described for the particular preferred embodiments, it is apparent to a person skilled in the art that various changes and modifications can be made on the basis of the teachings of the invention. It is apparent that such changes and modifications are within the spirit, scope, and intention of the invention as defined by the appended claims.

The present application is based on Japan Patent Application No. 2007-283074 filed on Oct. 31, 2007, the contents of which are incorporated herein for reference.

What is claimed is:

1. A fusible link unit, comprising:
  a bracket;
  a retaining portion provided in the bracket that retains a frame portion of a battery, the frame portion being located at a corner portion of the battery, and
  a bus bar configured to be attached to a battery post of the battery on an end surface of the battery;
  wherein the retaining portion has a pair of leg portions which extend outwardly from the bracket and abut against two side surfaces, which are different from the end surface, forming the corner portion of the battery; and
  wherein at least one of the leg portions is a flexible portion which is resiliently brought into contact with one of the side surfaces of the battery; and
  wherein the bracket is separated from the end surface,
  wherein at least one of the leg portions has a hook portion provided at its distal end that retains the frame portion of the battery formed on a first side surface of said two side surfaces of the battery, and at least one of the leg portions has an abutment surface configured to resiliently contact a second side surface of said two side surfaces of the battery.

* * * * *